United States Patent
Chun et al.

(10) Patent No.: US 11,889,640 B2
(45) Date of Patent: Jan. 30, 2024

(54) ELECTRONIC DEVICE INCLUDING SUPPORTING MEMBER

(71) Applicant: SAMSUNG ELECTRONICS CO., LTD., Suwon-si (KR)

(72) Inventors: Woosung Chun, Suwon-si (KR); Soojung Kim, Suwon-si (KR); Joon Heo, Suwon-si (KR); Hyunju Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 253 days.

(21) Appl. No.: 17/434,993

(22) PCT Filed: Aug. 3, 2021

(86) PCT No.: PCT/KR2021/010179
§ 371 (c)(1),
(2) Date: Aug. 30, 2021

(87) PCT Pub. No.: WO2022/050581
PCT Pub. Date: Mar. 10, 2022

(65) Prior Publication Data
US 2022/0322544 A1    Oct. 6, 2022

(30) Foreign Application Priority Data

Sep. 3, 2020   (KR) .......................... 10-2020-0112668

(51) Int. Cl.
*H05K 5/00* (2006.01)
*H05K 5/02* (2006.01)

(52) U.S. Cl.
CPC ......... *H05K 5/0086* (2013.01); *H05K 5/0017* (2013.01); *H05K 5/0226* (2013.01)

(58) Field of Classification Search
CPC .... G06F 1/1681; G06F 1/1652; G06F 1/1616; G06F 1/1641; G06F 1/1656;
(Continued)

(56) References Cited

U.S. PATENT DOCUMENTS

2016/0018851 A1    1/2016   Kwon et al.
2017/0331933 A1   11/2017   Iwamoto et al.
(Continued)

FOREIGN PATENT DOCUMENTS

KR   2000-0038853      7/2000
KR   10-2006-0029896   4/2006
(Continued)

OTHER PUBLICATIONS

Search Report and Written Opinion dated Nov. 9, 2021 in counterpart International Patent Application No. PCT/KR2021/010179.
(Continued)

*Primary Examiner* — Michael A Matey
(74) *Attorney, Agent, or Firm* — Nixon & Vanderhye, P.C.

(57) ABSTRACT

According to various embodiments of the disclosure, an electronic device may comprise: a foldable housing including a hinge structure comprising a hinge, a first housing connected to the hinge structure and including a first surface and a second surface spaced apart from the first surface and inclined at a first angle with respect to the first surface and a second housing connected to the hinge structure and including a third surface and a fourth surface spaced apart from the third surface, wherein in a folded state, the first surface faces the third surface and, in a fully unfolded state, a direction in which the first surface faces is identical to a direction in which the third surface faces, a first support disposed in the first housing and including a fifth surface inclined at a second angle different from the first angle with
(Continued)

respect to the first surface, a first battery disposed on the fifth surface, and a display including a display panel extending from the first surface to the third surface and a display driving circuit disposed between the first surface and the first battery.

15 Claims, 9 Drawing Sheets

(58) Field of Classification Search
CPC .... G06F 1/1647; G06F 1/1637; G06F 1/1618; G06F 1/1635; G06F 3/147; H04M 2201/38; H04M 1/0214; H04M 1/0268; H04M 1/022; H04M 1/0277; H04M 1/0262; H04M 2250/16; H05K 5/0226; H05K 2201/10128; H05K 5/0086; H05K 5/0017; H05K 5/0026; G09G 2380/02; G09G 3/035
See application file for complete search history.

(56) References Cited

U.S. PATENT DOCUMENTS

| | | | |
|---|---|---|---|
| 2017/0374749 A1 | 12/2017 | Lee et al. | |
| 2018/0324964 A1* | 11/2018 | Yoo | H01Q 1/2266 |
| 2019/0252766 A1 | 8/2019 | Jeon et al. | |
| 2019/0320048 A1 | 10/2019 | Yang et al. | |
| 2019/0369668 A1 | 12/2019 | Kim et al. | |
| 2020/0225711 A1* | 7/2020 | Pelissier | G06F 1/1624 |
| 2020/0264827 A1* | 8/2020 | Choi | G06F 3/04845 |
| 2020/0266384 A1* | 8/2020 | Choi | H05K 5/0226 |
| 2020/0267838 A1* | 8/2020 | An | H04M 1/0216 |
| 2020/0267859 A1* | 8/2020 | Kim | G06F 1/1641 |
| 2020/0319673 A1* | 10/2020 | Lee | H04M 1/0243 |
| 2020/0356143 A1* | 11/2020 | Oh | G06F 1/203 |
| 2021/0041917 A1* | 2/2021 | Moon | G06F 1/1616 |
| 2021/0058503 A1* | 2/2021 | Lee | H04M 1/72454 |
| 2022/0155826 A1* | 5/2022 | An | G06F 1/1652 |

FOREIGN PATENT DOCUMENTS

| | | |
|---|---|---|
| KR | 10-2016-0009890 | 1/2016 |
| KR | 10-2017-0111972 | 10/2017 |
| KR | 10-2019-0098527 | 8/2019 |
| WO | 2014/147970 | 9/2014 |

OTHER PUBLICATIONS

Extended European Search Report dated Nov. 6, 2023 issued in European Patent Application No. 21864542.2.

* cited by examiner

ELECTRONIC DEVICE INCLUDING SUPPORTING MEMBER

CROSS-REFERENCE TO RELATED APPLICATION

This application is a national stage application of International Application No. PCT/KR2021/010179 designating the United States, filed on Aug. 3, 2021 in the Korean Intellectual Property Receiving Office claiming priority to Korean Patent Application No. 10-2020-0112668, filed on Sep. 3, 2020, in the Korean Intellectual Property Office, the disclosures of which are incorporated by reference herein in their entireties.

BACKGROUND

Field

The disclosure relates to an electronic device including a supporting member.

Description of Related Art

Advancing information communication and semiconductor technologies accelerate the spread and use of various electronic devices. In particular, recent electronic devices are being developed to carry out communication while carried on. Electronic devices may output stored information as sounds or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling and e-wallet function. Such electronic devices become compact enough for users to carry in a convenient way.

As mobile communication services extend up to multimedia service sectors, the display of the electronic device may be increased to allow the user satisfactory use of multimedia services as well as voice call or text messaging services. Accordingly, a foldable display may be disposed on the entire area of the housing structure separated to be foldable.

To enhance the aesthetic feel of electronic devices, demand for electronic devices in various shapes is increasing.

Electronic devices use secondary batteries, such as lithium ion batteries, as an energy source. In particular, fixed-form batteries which are higher in efficiency than free-form batteries are used as batteries for electronic devices. However, when electronic devices come in various shapes, a mismatch in shape between the electronic device and the fixed-form battery may limit efficient use of the mounting space in the electronic device. In particular, for foldable electronic devices which include a foldable display area and a hinge structure, shape inconsistency between the electronic device and the fixed-form battery renders it more difficult to secure a mounting space and battery capacity.

SUMMARY

Embodiments of the disclosure may provide an electronic device with battery capacity increased by efficiently using the mounting space using a supporting member including a surface inclined with respect to the outer surface of the electronic device.

The disclosure is not limited to the foregoing embodiments but various modifications or changes may rather be made thereto without departing from the spirit and scope of the disclosure.

According to various example embodiments of the disclosure, an electronic device may comprise: a foldable housing including a hinge structure comprising a hinge, a first housing connected to the hinge structure and including a first surface and a second surface spaced apart from the first surface and inclined at a first angle with respect to the first surface and a second housing connected to the hinge structure and including a third surface and a fourth surface spaced apart from the third surface, wherein in a folded state, the first surface faces the third surface and, in a fully unfolded state, a direction in which the first surface faces is identical to a direction in which the third surface faces, a first support disposed in the first housing and including a fifth surface inclined at a second angle different from the first angle with respect to the first surface, a first battery disposed on the fifth surface, and a display including a display panel extending from the first surface to the third surface and a display driving circuit disposed between the first surface and the first battery.

According to various example embodiments of the disclosure, an electronic device may comprise: a foldable housing including a hinge structure comprising a hinge, a first housing connected to the hinge structure and including a first surface and a second surface spaced apart from the first surface and inclined at a first angle with respect to the first surface and a second housing connected to the hinge structure and including a third surface and a fourth surface spaced apart from the third surface, wherein in a folded state, the first surface faces the third surface and, in a fully unfolded state, a direction in which the first surface faces is identical to a direction in which the third surface faces, a first battery disposed in the first housing, a first support disposed in the first housing and supporting the first battery, the first support including a first area adjacent to the hinge structure and a second area adjacent to an end of the first housing, a first thickness of the first area being larger than a second thickness of the second area, and a display including a display panel extending from the first surface to the third surface and a display driving circuit disposed between the first surface and the first battery.

According to various example embodiments of the disclosure, an electronic device may include a support including a surface inclined with respect to the outer surface of the electronic device and a battery disposed on the support. The capacity of the battery inclined with respect to the outer surface of the electronic device may be larger than the capacity of the battery disposed in parallel with the outer surface of the electronic device.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
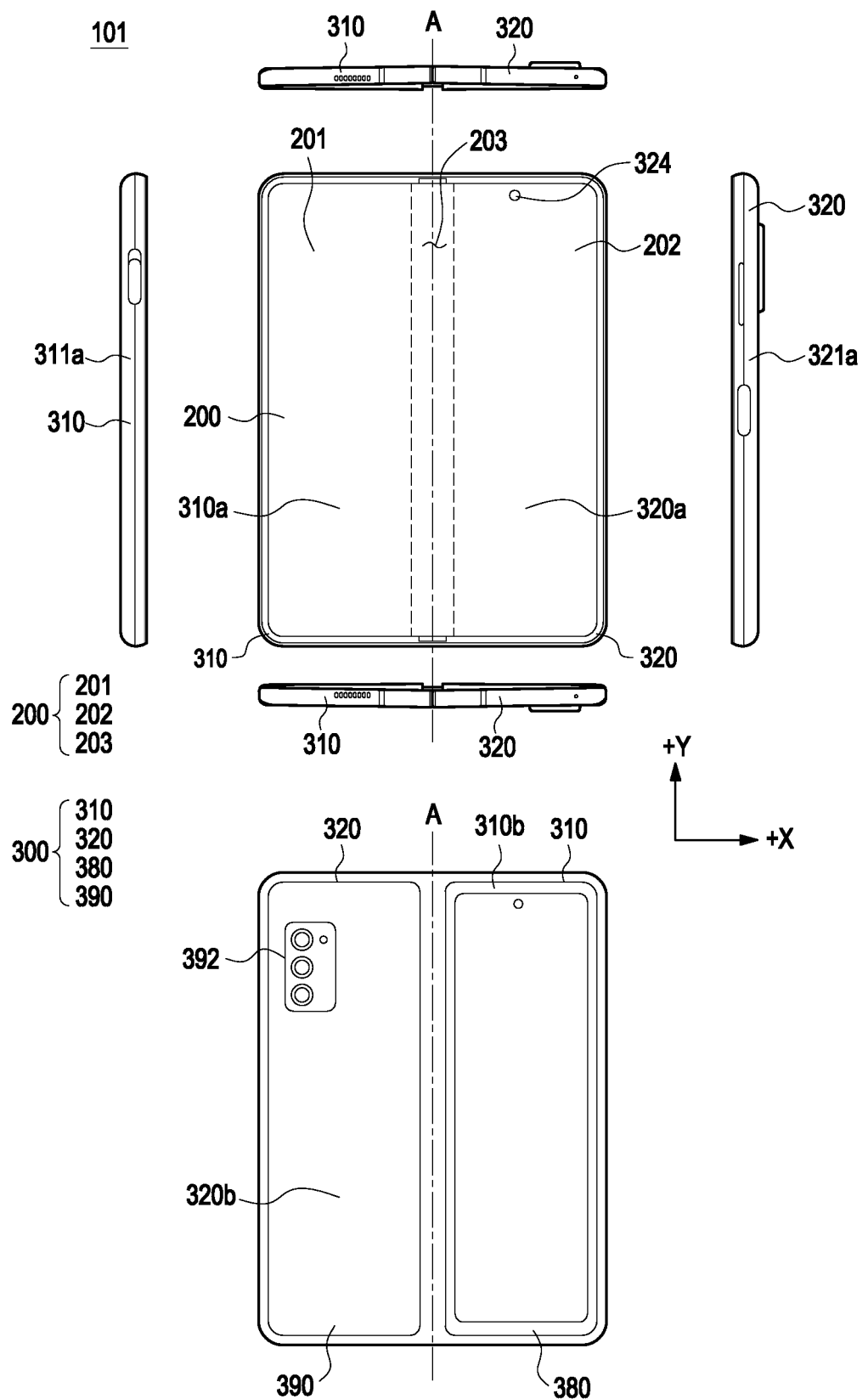
FIG. 1 is a diagram illustrating an unfolded state of an example electronic device according to various embodiments.

The electronic device according to various embodiments may be one of various types of electronic devices. The electronic devices may include, for example, a portable communication device (e.g., a smart phone), a computer device, a portable multimedia device, a portable medical device, a camera, a wearable device, a home appliance, or the like. According to an embodiment of the disclosure, the electronic device is not limited to the above-listed embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
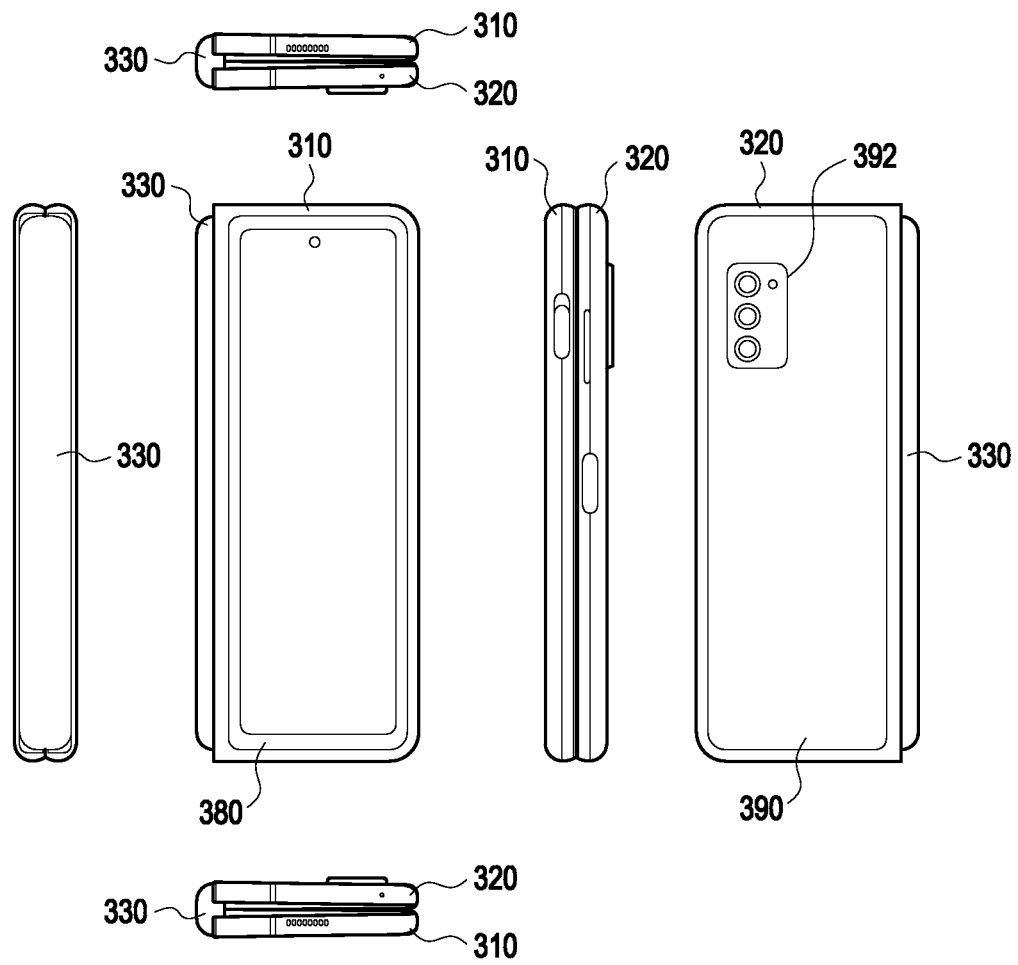
FIG. 2 is a diagram illustrating a folded state of an electronic device according to various embodiments.

FIG. 1 is a diagram illustrating an unfolded state of an electronic device according to various embodiments. FIG. 2 is a diagram illustrating a folded state of an electronic device according to various embodiments.

Referring to FIGS. 1 and 2, according to an embodiment, an electronic device 101 may include a foldable housing 300, a hinge cover (e.g., the hinge cover 330 of FIG. 2) covering a foldable portion of the foldable housing 300, and a flexible or foldable display 200 (hereinafter, simply "display 200") disposed in a space formed by the foldable housing 300. According to an embodiment, the surface on which the display 200 is disposed may be referred to as a front surface (e.g., a first surface 310a and a third surface 320a) of the electronic device 101. A surface opposite to the front surface may be referred to as a rear surface (e.g., a second surface 310b and a fourth surface 320b) of the electronic device 101. A surface surrounding at least a portion of the space between the front and rear surfaces may be referred to as a side surface (e.g., a first side surface 311a and a second side surface 321a) of the electronic device 101.

Figure 3:
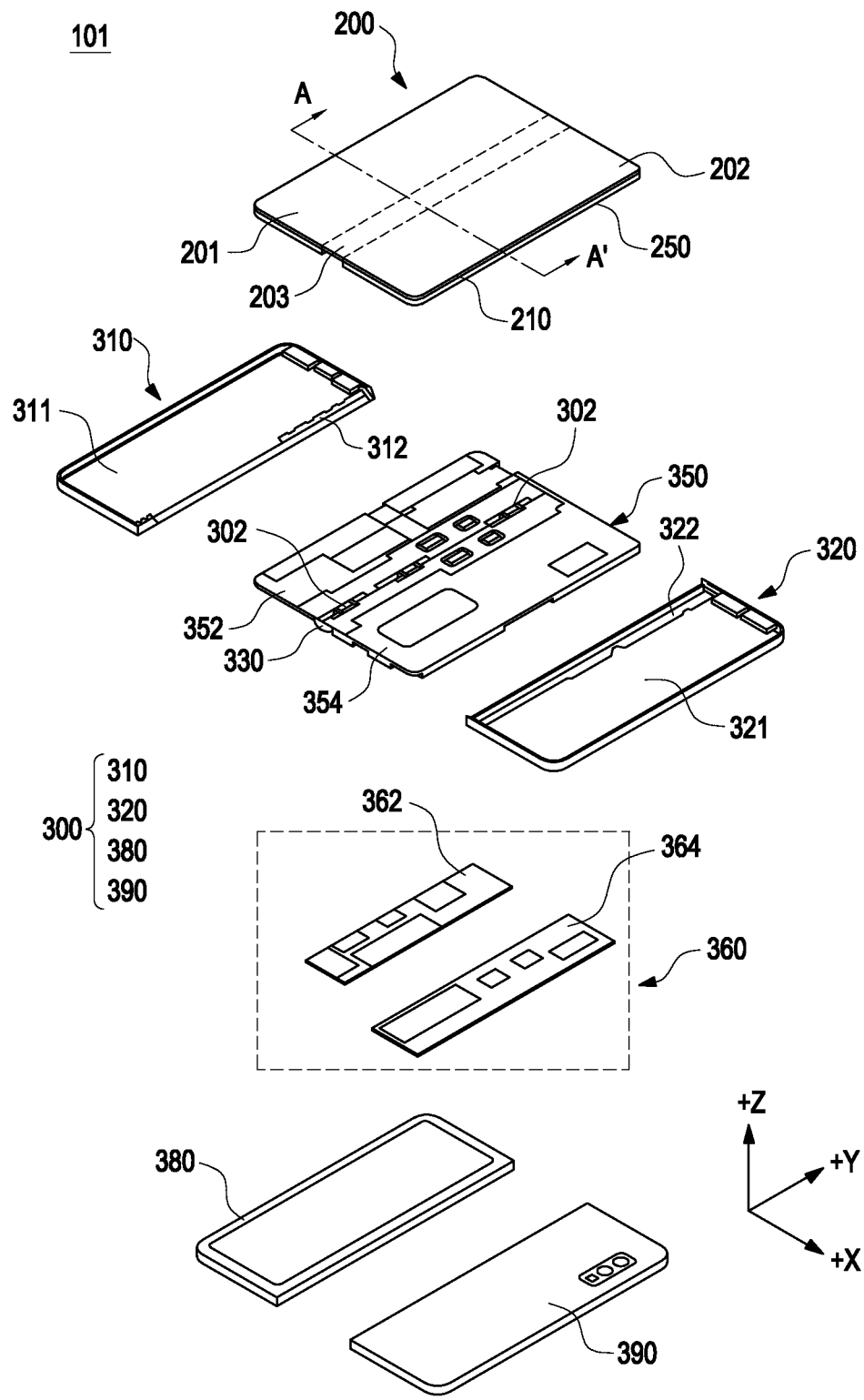
FIG. 3 is an exploded perspective view illustrating an electronic device according to various embodiments.

According to various embodiments, the foldable housing 300 may include a first housing 310, a second housing 320 including a sensor area 324, and a hinge structure (e.g., the hinge structure 302 of FIG. 3).

According to various embodiments, the first housing 310 may be connected to the hinge structure 302 and may include a first surface 310a and a second surface 310b spaced apart from the first surface 310a and at least partially inclined at a first angle (e.g., a first angle x1 of FIG. 5) from the first surface. The second housing 320 may be connected to the hinge structure 302 and may include a third surface 320a and a fourth surface 320b spaced apart from the third surface 320a and inclined at a third angle (not shown) from the third surface 320a. The second housing 320 may rotate on the hinge structure 302 from the first housing 310. Thus, the electronic device 101 may turn into a folded state or unfolded state. In the folded state of the electronic device 101, the first surface 310a may face the third surface 320a and, in the unfolded state (e.g., a fully unfolded state), the direction (e.g., a third direction) in which the third surface faces may be the same as the direction (e.g., a first direction) in which the first surface faces.

According to an embodiment, at least a portion of the fourth surface 320b may be plane symmetrical with at least a portion of the second surface 310b. For example, the third angle between the fourth surface 320b and the third surface 320a may be identical to a first angle x1 between the second surface 310b and the first surface 310a.

According to various embodiments, the first housing 310 and the second housing 320 are disposed on both sides of the folding axis A and be overall symmetrical in shape with respect to the folding axis A. As set forth below, the first housing 310 and the second housing 320 may have different angles or distances formed therebetween depending on whether the electronic device 101 is in the unfolded, folded, or intermediate state.

According to various embodiments, the first housing 310 and the second housing 320 may be shaped to have different thicknesses in the width direction (e.g., the X-axis direction). For example, the thickness of the first housing 310 may decrease from the center (e.g., the folding axis A or the hinge structure 302 of FIG. 3) to a side (e.g., the first side surface 311a), and the thickness of the second housing 320 may decrease from the center (e.g., the folding axis A or the hinge structure 302 of FIG. 3) to a side (e.g., the second side surface 321a).

According to various embodiments, as shown in FIG. 1, the first housing 310 and the second housing 320 together may form a recess to receive the display 200.

According to various embodiments, the first housing 310 and the second housing 320 may at least partially be formed of a metal or non-metallic material with a rigidity selected to support the display 200. At least a portion formed of metal may provide a ground plane of the electronic device 101 and may be electrically connected with a ground line formed on a printed circuit board (e.g., the board unit 360 of FIG. 3).

According to various embodiments, the sensor area 324 may be formed adjacent to an edge of the second housing 320 and to have a predetermined area. However, the placement, shape, or size of the sensor area 324 is not limited to those illustrated. For example, in an embodiment, the sensor area 324 may be formed adjacent to a corner of the second housing 320 and to have a predetermined area or may be provided in a different corner of the second housing or in any area between the top corner and the bottom corner. In an embodiment, components for performing various functions, embedded in the electronic device 10, may be exposed through the sensor area 324 or one or more openings in the sensor area 324 to the front surface of the electronic device 101. In various embodiments, the components may include various kinds of sensors. The sensor may include, for example, and without limitation, at least one of a front-facing camera, a receiver, a proximity sensor, or the like.

According to various embodiments, a front camera exposed to the front surface of the electronic device 101 through one or more openings prepared in the sensor area 324 or a rear camera exposed through a second rear surface area 392 of the second rear cover 390 may include, for example, and without limitation, one or more lenses, an image sensor, flash, and/or an image signal processor. The flash may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101.

Referring to FIG. 2, the hinge cover 330 may be disposed between the first housing 310 and the second housing 320 to hide the internal components (e.g., the hinge structure 302 of FIG. 3). According to an embodiment, the hinge cover 330 may be hidden by a portion of the first housing 310 and second housing 320 or be exposed to the outside depending on the state (e.g., the unfolded state (e.g., flat state) or folded state) of the electronic device 101.

According to an embodiment, as shown in FIG. 1, in the unfolded state of the electronic device 101, the hinge cover 330 may be hidden, and thus not exposed, by the first housing 310 and the second housing 320. As another example, as shown in FIG. 2, in the folded state (e.g., a fully folded state) of the electronic device 101, the hinge cover 330 may be exposed to the outside between the first housing 310 and the second housing 320. As another example, in an intermediate state in which the first housing 310 and the second housing 320 are folded with a certain angle, the hinge cover 330 may be partially exposed to the outside between the first housing 310 and the second housing 320. In this case, however, the exposed area may be smaller than in the fully folded state. According to an embodiment, the hinge cover 330 may include a curved surface.

According to various embodiments, the display 200 may be disposed in a space formed by the foldable housing 300. For example, the display 200 may be seated in a recess formed by the foldable housing 300 and may occupy most of the front surface of the electronic device 101. Thus, the front surface of the electronic device 101 may include the display 200 and a partial area of the first housing 310 and a partial area of the second housing 320, which are adjacent to the display 200. The rear surface of the electronic device 101 may include a first rear cover (e.g., the first rear cover 380 of FIG. 3), a partial area of the first housing 310, adjacent to the first rear cover 380, a second rear cover 390, and a partial area of the second housing 320, adjacent to the second rear cover (e.g., the second rear cover 390 of FIG. 3).

According to various embodiments, the display 200 may refer, for example, to a display at least a portion of which may be transformed into a flat or curved surface. According to an embodiment, the display 200 may include a folding area 203, a first display area 201 disposed on one side of the folding area 203 (e.g., the left side of the folding area 203 of FIG. 1), and a second display area 202 disposed on the opposite side of the folding area 203 (e.g., the right side of the folding area 203 of FIG. 1). According to an embodiment, the folding area 203 may be formed along the hinge structure (e.g., the hinge structure 302 of FIG. 3).

However, the segmentation of the display 200 as shown in FIG. 1 is merely an example, and the display 200 may be divided into a plurality of (e.g., four or more, or two) areas depending on the structure or function of the display 200. For example, in the embodiment illustrated in FIG. 1, the display 200 may be divided into the areas by the folding area 203 or folding axis (axis A) extending in parallel with the y axis but, in an embodiment, the display 200 may be divided into the areas with respect to another folding area (e.g., a folding area parallel with the x axis) or another folding axis (e.g., a folding axis parallel with the x axis). According to an embodiment, the display 200 may be coupled with or disposed adjacent to, for example, and without limitation, a touch detection circuit, a pressure sensor capable of measuring the strength (pressure) of touches, and/or a digitizer for detecting a magnetic field-type stylus pen, or the like.

According to various embodiments, the first display area 201 and the second display area 202 may be overall symmetrical in shape with respect to the folding area 203. According to an embodiment, unlike the first display area 201, the second display area 202 may include a hole or notch due to the presence of the sensor area 324 but, for the rest, may be symmetrical in shape with the first display area 201. In other words, the first display area 201 and the second display area 202 may include symmetrical portions and asymmetrical portions.

Described below are the operation of the first housing 310 and the second housing 320 and each area of the display 200 depending on the state (e.g., the unfolded state (or flat state) and folded state) of the electronic device 101.

According to an embodiment, when the electronic device 101 is in the unfolded state (flat state) (e.g., FIG. 1), the first surface 310a of the first housing 310 and the third surface 320a of the second housing 320 are angled at 180 degrees from each other while facing in the same direction. The surface of the first display area 201 of the display 200 and the surface of the second display area 202 may be angled at 180 degrees from each other (e.g., a fully unfolded state) while facing in the same direction (e.g., forward from the front surface of the electronic device). The folding area 203 may form the same plane with the first display area 201 and the second display area 202.

According to various embodiments, when the electronic device 101 is in the folded state (e.g., FIG. 2), the first housing 310 and the second housing 320 may be disposed to face each other. The surface of the first display area 201 and the surface of the second display area 202 of the display 200 may be angled at a small angle (e.g., an angle between 0 degrees and 10 degrees) therefrom while facing each other. At least a portion of the folding area 203 may have a curved surface with a predetermined curvature.

According to various embodiments, when the electronic device 101 is in the intermediate state (folded state) (e.g., FIG. 3), the first housing 310 and the second housing 320 may be disposed at a certain angle therebetween. The surface of the first display area 201 of the display 200 and the surface of the second display area 202 may form an angle which is larger than the angle in the folded state and smaller than the angle in the unfolded state. The folding area 203 may at least partially have a curved surface with a predetermined curvature and, in this case, the curvature may be smaller than that when it is in the folded state.

FIG. 3 is an exploded perspective view illustrating an electronic device according to various embodiments.

Referring to FIG. 3, an electronic device 101 may include a foldable housing 300, a display 200, and a board unit 360. The foldable housing 300 may include a first housing 310, a second housing 320, a bracket assembly 350, a first rear cover 380, a second rear cover 390, and a hinge structure (e.g., including a hinge) 302. The configuration of the foldable housing 300 and the display 200 of FIG. 3 may be the same in whole or part as the configuration of the foldable housing 300 and the display 200 of FIGS. 1 and 2.

According to various embodiments, the display 200 may visually provide information to the outside (e.g., the user) of the electronic device 101. The display 200 may include, for example, and without limitation, a display, a hologram device, a projector, or the like, and control circuitry to control a corresponding one of the display, hologram device, and projector. According to an embodiment, the display 200 may include a touch sensor configured to detect a touch, or a pressure sensor configured to measure the intensity of a force generated by the touch.

According to various embodiments, the display 200 may include a display panel 210 and at least one support plate 250 on which the display panel 210 is seated. The support plate 250 may be disposed between the display panel 210 and the bracket assembly 350.

According to various embodiments, the bracket assembly 350 may include a first mid plate 352 and a second mid plate 354. The hinge structure 302 may be disposed between the first mid plate 352 and the second mid plate 354. When viewed from the outside, the hinge structure 302 may be covered by a hinge cover 330. According to an embodiment, a printed circuit board (e.g., a flexible printed circuit (FPC)), not shown, crossing the first mid plate 352 and the second mid plate 354 may be disposed on the bracket assembly 350.

According to various embodiments, the board unit 360 may include a first circuit board 362 disposed on the first mid plate 352 and a second circuit board 364 disposed on the second mid plate 354. The first circuit board 362 and the second circuit board 364 may be disposed in a space formed by the bracket assembly 350, the first housing 310, the second housing 320, the first rear cover 380, and the second rear cover 390. Components for implementing various functions of the electronic device 101 may be mounted on the first circuit board 362 and the second circuit board 364. According to an embodiment, a processor (not shown) that may control at least one other component (e.g., a hardware or software component) of the electronic device 101 by executing software and perform various data processing or computation may be positioned on the board unit 360.

According to various embodiments, the first housing 310 and the second housing 320 may be assembled together to be coupled to two opposite sides of the bracket assembly 350, with the display 200 coupled to the bracket assembly 350. According to an embodiment, the first housing 310 may include a first side member 311 at least partially surrounding the side surface of the first mid plate 352, and the second housing 320 may include a second side member 321 at least partially surrounding the side surface of the second mid plate 354. The first housing 310 may include a first rotation supporting surface 312, and the second housing 320 may include a second rotation supporting surface 322 corresponding to the first rotation supporting surface 312. The first rotation supporting surface 312 and the second rotation supporting surface 322 may include a curved surface corresponding to a curved surface included in the hinge cover 330. According to an embodiment, the first side member 311 may include a first side surface 311a (refer to FIG. 1) surrounding at least a portion between the first surface 310a and the second surface 310b and perpendicular to the first direction. According to an embodiment, the second side member 321 may include a second side surface surrounding at least a portion between the third surface 320a and the fourth surface 320b (refer to FIG. 1) and perpendicular to the third direction. According to an embodiment, in the unfolded state of the electronic device 101 (e.g., the electronic device of FIG. 1), the first rotation supporting surface 312 and the second rotation supporting surface 322 may cover the hinge cover 330, and the hinge cover 330 may not or minimally be exposed to the rear surface of the electronic device 101. As another example, in the folded state of the electronic device 101 (e.g., the electronic device of FIG. 2), the first rotation supporting surface 312 and the second rotation supporting surface 322 may rotate along the curved surface included in the hinge cover 330, allowing the hinge cover 330 to be maximally exposed to the rear surface of the electronic device 101.

According to various embodiments, the electronic device 101 may include a first rear cover 380 and a second rear cover 390. The first rear cover 380 may be disposed on one side of the folding axis (e.g., the folding axis A of FIG. 1) on the rear surface of the electronic device 101 and may have a substantially rectangular periphery which may be surrounded by the first housing 310. Similarly, the second rear cover 390 may be disposed on the opposite side of the folding axis A on the rear surface of the electronic device 101 and its periphery may be surrounded by the second housing 320.

According to various embodiments, the first rear cover 380 and the second rear cover 390 may be substantially symmetrical in shape with respect to the folding axis (axis A). However, the first rear cover 380 and the second rear cover 390 are not necessarily symmetrical in shape. In an embodiment, the electronic device 101 may include the first rear cover 380 and the second rear cover 390 in various shapes. In an embodiment, the first rear cover 380 may be integrally formed with the first housing 310, and the second rear cover 390 may be integrally formed with the second housing 320.

According to various embodiments, the first rear cover 380 and the second rear cover 390 may be formed of laminated or colored glass, ceramic, polymer, metal (e.g., aluminum, stainless steel (STS), or magnesium), or a combination of at least two thereof).

The foldable housing 300 of the electronic device 101 is not limited to the shape and coupling shown in FIGS. 1, 2 and 3 but may be implemented in other shapes or via a combination and/or coupling of the components. For example, in an embodiment, the first housing 310 and the first rear cover 380 may be integrally formed with each other, and the second housing 320 and the second rear cover 390 may be integrally formed with each other.

Figure 4:
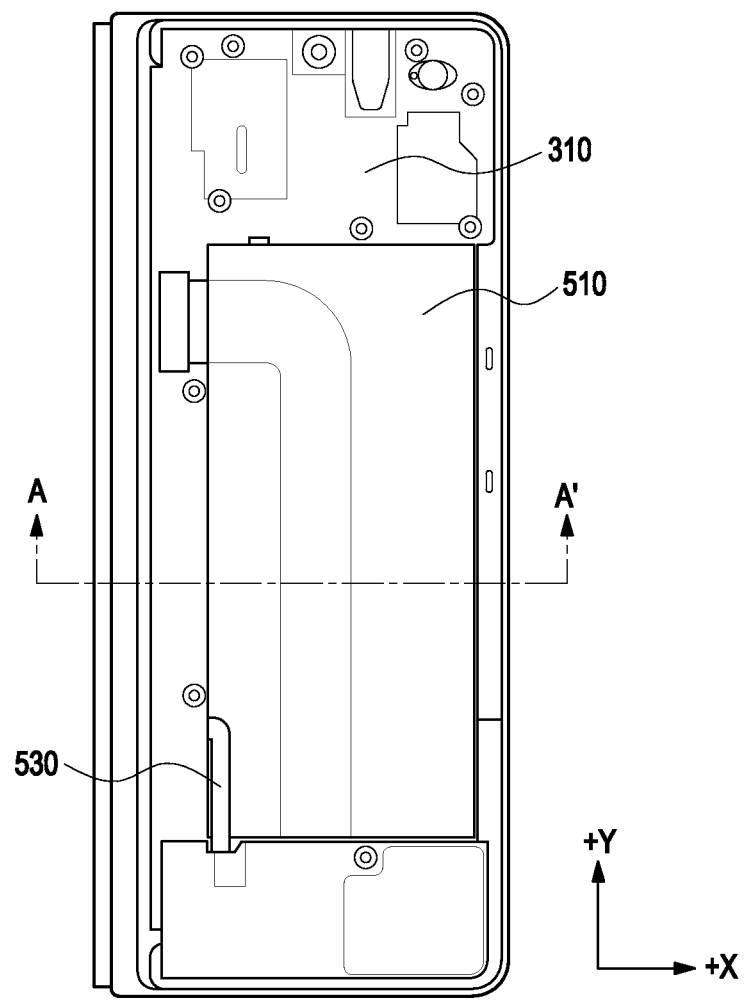
FIG. 4 is a rear see-through view illustrating a portion of an electronic device according to various embodiments.
Figure 5A:
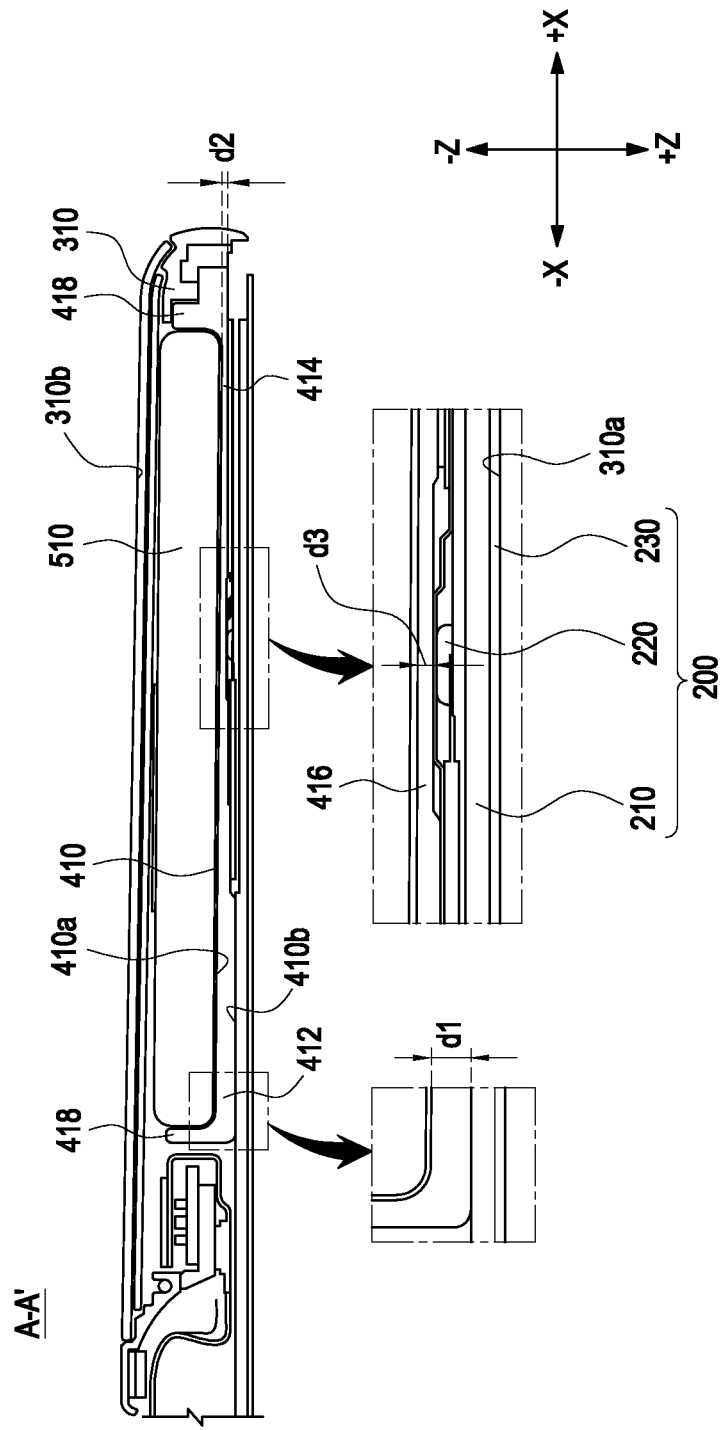
FIGS. 5A and 5B are cross-sectional views taken along line A-A' of FIG. 4 according to various embodiments.
Figure 5B:
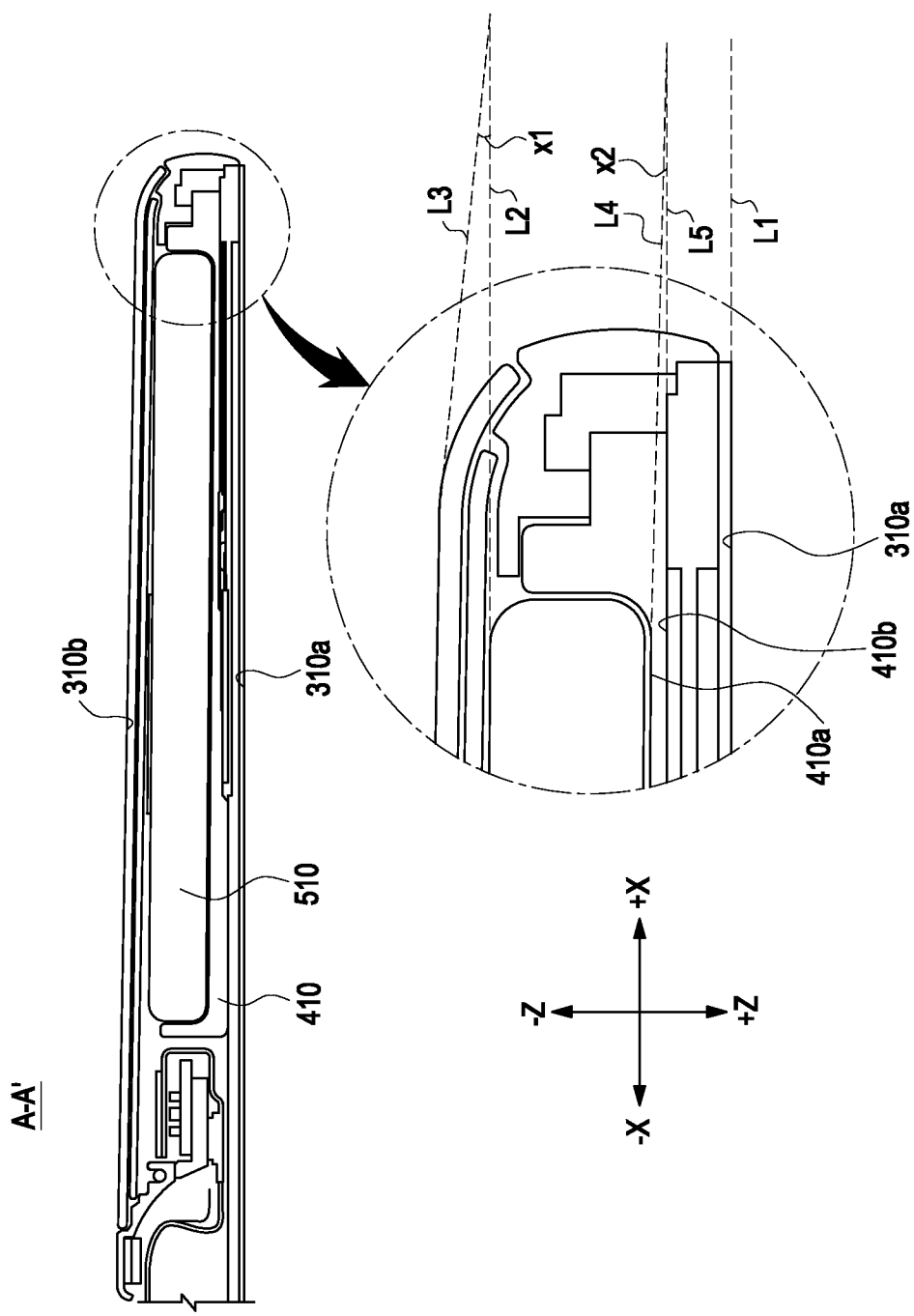
Figure 6:
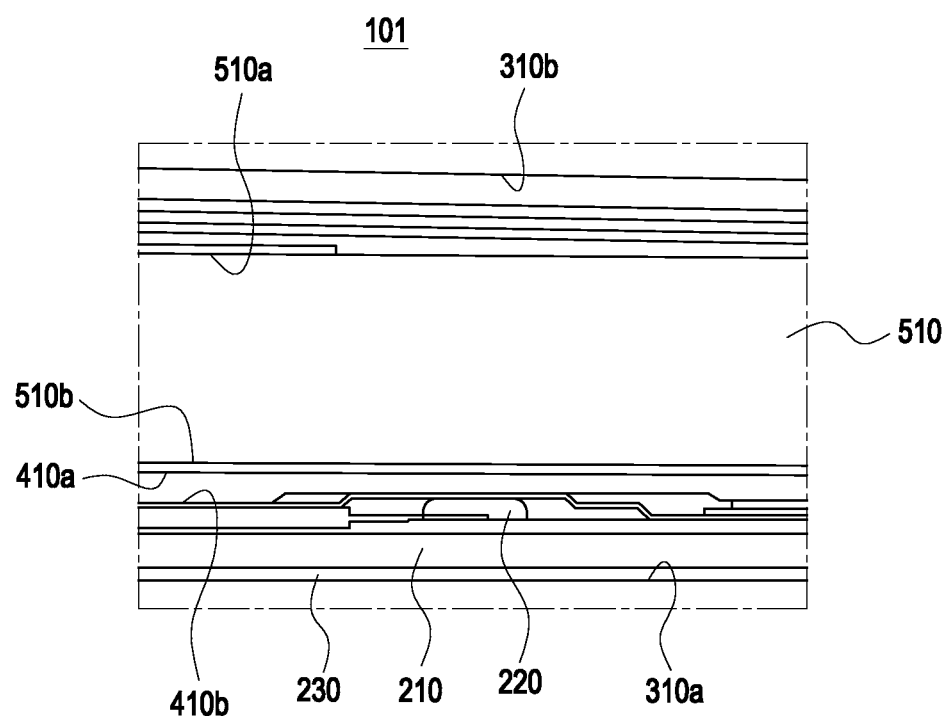
FIG. 6 is an enlarged view illustrating a portion of FIG. 5A according to various embodiments.

FIG. 4 is a rear see-through view illustrating a portion of an electronic device according to various embodiments. FIGS. 5A and 5B are cross-sectional views taken along line A-A' of FIG. 4 according to various embodiments. FIG. 6 is an enlarged view illustrating a portion of FIG. 5A according to various embodiments.

Referring to FIGS. 4, 5A, 5B and 6, an electronic device 101 may include a display 200, a first housing 310, a first supporting member (e.g., support) 410, and a first battery 510. The configurations of the display 200 and the first housing 310 of FIGS. 4, 5A, 5B and 6 may be the same in whole or part as the configurations of the display 200 and the foldable housing 300 of FIGS. 1, 2 and 3.

According to various embodiments, the display 200 may be formed to be flexible. For example, the display 200 may be foldable in the entire area so that it may be folded by the rotation of the hinge structure (e.g., the hinge structure 302 of FIG. 3).

According to various embodiments, the display panel 210 may be disposed on the first housing 310 and the second housing 320. For example, the display panel 210 may extend from the first surface 310a of the first housing 310 to the third surface 320a of the second housing 320.

According to various embodiments, the display panel 210 may include at least one substantially flat layer. For example, the display panel 210 may include at least of a pixel layer for providing various images to the user, a touch detection circuit layer for detecting the user's input, at least polarization layer for reducing reflection of light emitted to the electronic device 101, at least one adhesive layer for coupling the components of the display panel 210, a heat dissipation layer for dissipating heat generated from the display 200, or a cushion layer for absorbing external pressure on the electronic device 101.

According to various embodiments, the display 200 may include a display driving circuit 220 capable of driving the display panel 210. According to an embodiment, the display driving circuit 220 may convert a digital signal received from a processor (not shown) of the electronic device 101 into an RGB analog value and transmit it to the display panel 210.

According to various embodiments, the display driving circuit 220 may be positioned under the display panel 210 (e.g., in the −Z direction). According to an embodiment, the display driving circuit 220 may be disposed in a chip-on-plastic (COP) manner. For example, the display driving circuit 220 may be connected to the display panel 210 and disposed on a display substrate (not shown) formed of plastic (e.g., polyimide). For example, the display driving circuit 220 may be connected to the display panel 210 through the bent display substrate, and at least a portion of the display substrate and the display driving circuit 220 may be positioned on the rear surface of the display panel 210. According to an embodiment, the display driving circuit 220 may be implemented in at least one chip. The display driving circuit 220 implemented in a chip is substantially rigid and thus may not be bent. For example, the display driving circuit 220 may not be disposed in a portion (e.g., the folding area 203 of FIG. 1) of the display 200 which is adjacent to the hinge structure 302 in the electronic device 101 including the hinge structure (e.g., the hinge structure 302 of FIG. 3).

According to various embodiments, the display driving circuit 220 may be disposed parallel to the folding area 203. According to an embodiment, the display driving circuit 220 may be disposed along a direction (e.g., the Y axis direction) parallel to a side surface (e.g., the first side surface 311a or the second side surface 321a) of the electronic device 101. According to an embodiment, the display driving circuit 220 may be disposed parallel to the folding axis A formed by the hinge structure (e.g., the hinge structure 302 of FIG. 3).

According to various embodiments, the display driving circuit 220 may be disposed in the first housing 310. According to an embodiment, the display driving circuit 220 may extend along one surface of the first display 201 disposed in the first housing 310.

According to various embodiments, the electronic device 200 may include a cover window 230. According to an embodiment, the cover window 230 may form at least a portion of the front surface (e.g., the first surface 310a or the third surface 320a of FIG. 1) of the electronic device 101. According to an embodiment, the cover window 230 may be disposed under the display panel 210 (e.g., in the +Z direction), protecting the display panel 210 from external impact.

According to various embodiments, the cover window 230 may be formed of various materials. For example, the cover window 230 may be formed of a material that is substantially transparent and flexible. According to an embodiment, the cover window 230 may be formed of ultra-thin glass (UTG). According to an embodiment, the cover window 230 may be formed of a polyimide (PI) film. According to an embodiment, the cover window 230 may form an outer surface of the electronic device 101. For example, the cover window 230 may define a first surface (e.g., the first surface 310a and the third surface 320a in FIG. 1).

According to various embodiments, the first supporting member 410 may include a support and be disposed in the first housing 310 and may support some of the components of the electronic device 101. For example, the first battery 510 may be disposed on the first supporting member 410. According to an embodiment, the first supporting member 410 may be integrally formed with the first side member 311 or the first rear cover 380 of FIG. 3.

According to various embodiments, the first housing 310 may include a first surface 310a and a second surface 310b inclined at a first angle x1 with respect to the first surface 310a.

According to various embodiments, the first supporting member 410 may include a sixth surface 410b and a fifth surface 410a inclined at a second angle x2 with respect to the sixth surface 410b. According to an embodiment, the sixth surface 410b may be parallel to the first surface 310a. For example, the sixth surface 410b may be inclined at the first angle x1 with respect to the second surface 310b. According to an embodiment, the sixth surface 410b may face at least a portion of the display panel 210. For example, a virtual third line L3 extending from the second surface 310b may be inclined at the first angle x1 with respect to a virtual second line L2 parallel to a virtual first line L1 extending from the first surface 310a, and a virtual fourth line L4 extending from the fifth surface 410a may be inclined at the second angle x2 with respect to a fifth line L5 parallel to the virtual first line L1 extending from the first surface 310a.

According to various embodiments, the second angle x2 between the fifth surface 410a and the sixth surface 410b may be smaller than the first angle x1 between the first surface 310a and the second surface 310b. For example, the second angle x2 may be in a range of about 40% to 100% of the first angle x1. According to an embodiment, the first angle x1 may, for example, be about 0.9 degrees, and the second angle x2 may be about 0.4 degrees. According to an embodiment, as the first angle x1 is formed to be larger than the second angle x2, some of the configurations in the first housing 310, e.g., a flexible printed circuit board (e.g., the flexible printed circuit board 530 of FIG. 4) described below, may be disposed between the second surface 310b and the first battery 510. Some of the components illustrated in FIG. 5B may be exaggerated for convenience of description.

According to various embodiments, the first supporting member 410 may include a plurality of areas having different thicknesses. For example, the first supporting member 410 may include a first area 412 positioned in a sixth direction (e.g., the –X direction) adjacent to the hinge structure (e.g., the hinge structure 302 of FIG. 3) and a second area 414 positioned in a fifth direction (e.g., the +X direction) facing an end of the electronic device 101. The first supporting member 410 may have a first thickness d1 in the first area 412 and a second thickness d2 in the second area 414. According to an embodiment, the fifth surface 410a of the first supporting member 410 may get farther from the sixth surface 410b of the first supporting member 410 or the first surface 310a of the electronic device 101 from the fifth direction (e.g., the +X direction) in which an end of the electronic device 101 is positioned to the sixth direction (e.g., the –X direction) in which the hinge structure (e.g., the hinge structure 302 of FIG. 3) is positioned. For example, the first thickness d1 may be larger than the second thickness d2. According to an embodiment, as the first thickness d1 of the first area 412 is larger than the second thickness d2, the stiffness (e.g., rigidity) inside the first housing 310 may be increased.

According to various embodiments, the first supporting member 410 may include a third area 416 positioned in at least a portion between the first area 412 and the second area 414. According to an embodiment, the third area 416 may be formed to have a third thickness d3, and the display driving circuit 220 may be disposed in the third area 416. For example, the display driving circuit 220 may be disposed between the first supporting member 410 and the first surface 310a of the electronic device 101 in the height direction (e.g., the Z axis direction) and in the third area 416 positioned between the first area 412 and the second area 414 in the width direction (e.g., the X axis direction). The first thickness d1 of the first area 412 may be greater than the third thickness d3 of the third area 416. According to an embodiment, the first area 412, the second area 414, and the third area 416 may form at least a portion of the fifth surface 410a of the first supporting member 410. According to an embodiment, the first area 412 and the second area 414 may form at least a portion of the sixth surface 410b of the first supporting member 410.

According to various embodiments, the first supporting member 410 may include a first protruding area 418. According to an embodiment, the first protruding area 418 may protrude toward the second surface 310b of the first housing 310 from at least a portion of the edge of the fifth surface 410a of the first supporting member 410. For example, the first protruding area 418 may protrude from the fifth surface 410a in a second direction (e.g., the —Z direction) which is opposite to the first direction (e.g., the +Z direction). According to an embodiment, the first protruding area 418 may surround at least a portion of the first battery 510.

According to various embodiments, the first battery 510 may supply power to at least one component of the electronic device 101. According to an embodiment, the first battery 510 may include, for example, a primary cell which is not rechargeable, a secondary cell which is rechargeable, or a fuel cell.

According to various embodiments, the first battery 510 may be disposed in the first housing 310. For example, the first battery 510 may be disposed on the fifth surface 410a of the first supporting member 410. The first battery 510 may include a 1-2th battery surface 510b facing the fifth surface 510a and a 1-1th battery surface 510a which is opposite to the 1-2th battery surface 510b. According to an embodiment, the 1-1th battery surface 510a and the 1-2th battery surface 510b may be inclined at the second angle x1 with respect to the first surface 310a of the electronic device 101.

According to various embodiments, in the electronic device 101 in which the second surface 310b is inclined at the first angle x1 with respect to the first surface 310a, the capacity of the first battery 510 inclined with respect to the first surface 310a may be larger than the capacity of a battery which is not inclined with respect to the first surface 310a. For example, when the second surface 310b of the electronic device 101 is inclined with respect to the first surface 310a, an empty space may be formed inside the first housing 310 adjacent to the second surface 310b so that the first battery 510 inclined with respect to the first surface 310a may be positioned in the empty space. According to an embodiment, the capacity of the first battery 510 inclined at about 0.4 degrees with respect to the first surface 310a may, for example, be 103% of the capacity of a battery not inclined with respect to the first surface 310a.

According to various embodiments, the flexible printed circuit board 530 may be disposed between at least a portion of the first battery 510 and the rear surface (e.g., the second surface 310b) of the electronic device 101. According to an embodiment, as the first angle x1, which is an angle between the second surface 310b and the first surface 310a of the electronic device 101, is larger than the second angle x2, which is an angle between the 1-1th battery surface 510a of the first battery 510 and the second surface 310b, an end of the first battery 510 may be spaced apart from the second surface 310b of the electronic device 101 or the first rear cover (e.g., the rear cover 380 of FIG. 3). For example, the first battery 510 may be spaced apart from the second surface 310b toward a sixth direction (e.g., the –X direction), and the flexible printed circuit board 530 may be disposed in the space where the first battery 510 is spaced apart from the second surface 310b.

Figure 7:
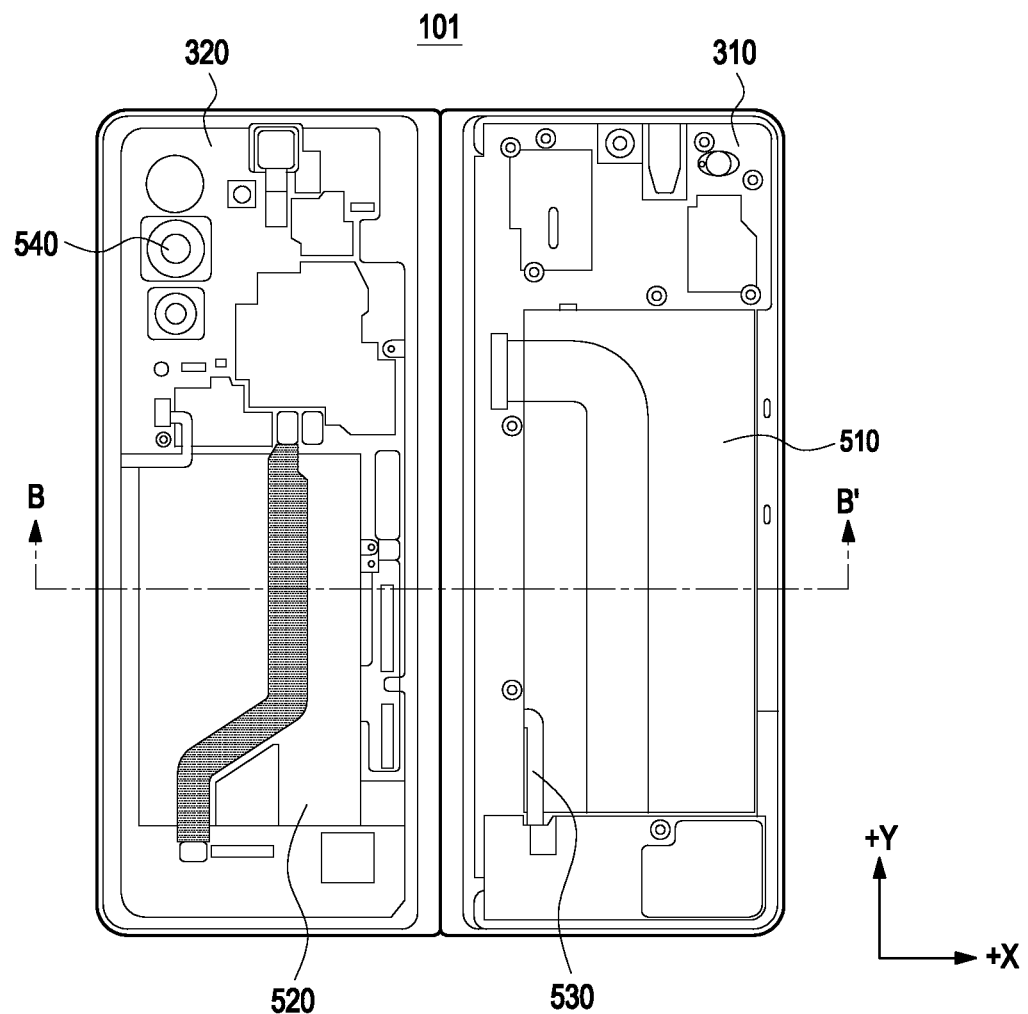
FIG. 7 is a rear see-through view illustrating an electronic device according to various embodiments.
Figure 8:
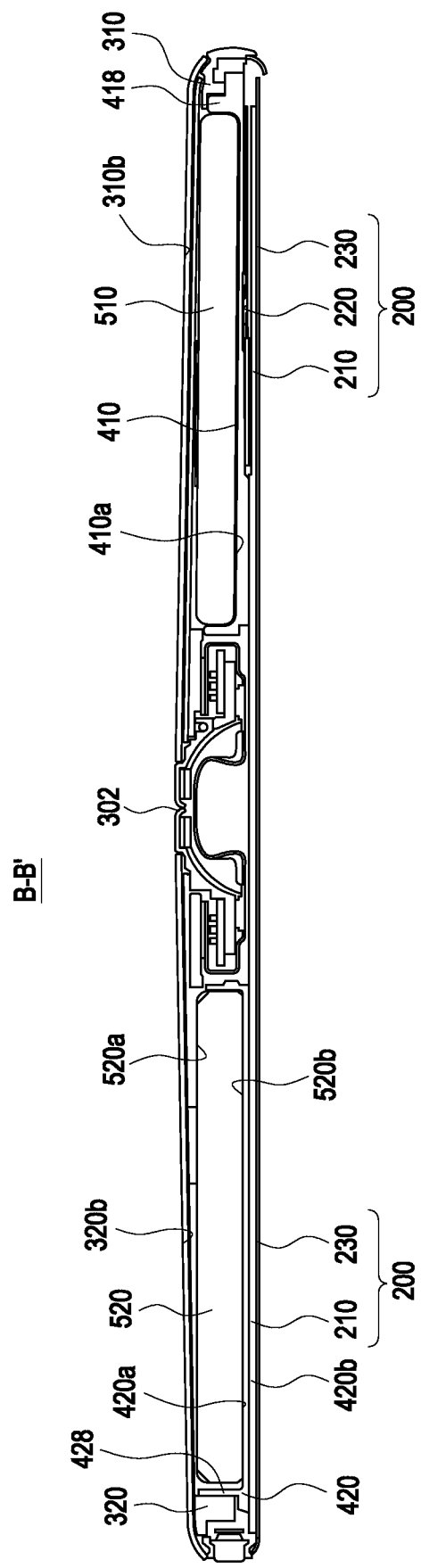
FIG. 8 is a cross-sectional view taken along line B-B' of FIG. 7 according to various embodiments.

FIG. 7 is a rear see-through view illustrating an electronic device according to various embodiments. FIG. 8 is a cross-sectional view taken along line B-B' of FIG. 7 according to various embodiments.

Referring to FIGS. 7 and 8, an electronic device 101 may include a display 200, a first housing 310, a second housing 320, a first supporting member (e.g., including a support) 410, a second supporting member (e.g., including a support) 420, a first battery 510, and a second battery 520. The configurations of the first housing 310, the first supporting member 410, and the first battery 510 of FIGS. 7 and 8 may be the same or similar in whole or part as the configurations of the first housing 310, the first supporting member 410, and the first battery 510 of FIGS. 4, 5A, 5B and 6, and the configuration of the second housing 320 may be the same or similar in whole or part as the second housing 320 of FIGS. 1, 2 and 3.

According to various embodiments, a portion (e.g., the second display area 202 of FIG. 1) of the display 200 may be disposed in the second housing 320. According to an embodiment, the display panel 210 and the cover window 230 may be disposed in the first housing 310 and the second housing 320, and the display driving circuit 220 may be disposed in the first housing 310.

According to various embodiments, the second supporting member 420 may be disposed in the second housing 320 and may support some of the components of the electronic device 101. For example, the second battery 520 may be disposed on the second supporting member 420. According to an embodiment, the second supporting member 420 may be integrally formed with the first side member 312 or the first rear cover 390 of FIG. 3.

According to various embodiments, the second supporting member 420 may include an eighth surface 420b facing the third surface 320a (refer to FIG. 1) of the second housing 320 and a seventh surface 420a parallel to the eighth surface 420b or the third surface 320a. According to an embodiment, since the display driving circuit 220 is positioned in the first housing 310 but not in the second housing 320, the surfaces (e.g., the seventh surface 420a and the eighth surface 420b) of the second supporting member 420 may be parallel to each other.

According to various embodiments, the electronic device 101 may include a main circuit board (e.g., the second circuit board 364 of FIG. 3) disposed in the second housing 320 and an auxiliary circuit board (e.g., the first circuit board 362 of FIG. 3) disposed in the first housing 310. According to an embodiment, the size of the second circuit board 364 may be larger than the size of the first circuit board 362, and the display driving circuit 220 may be disposed in the first housing 310 where the first circuit board 362 is positioned. According to various embodiments, the second battery 520 may supply power to at least one component of the electronic device 101. According to an embodiment, the second battery 520 may include, for example, a primary cell which is not rechargeable, a secondary cell which is rechargeable, or a fuel cell.

According to various embodiments, the second battery 520 may be disposed in the second housing 320. For example, the second battery 520 may be disposed on the seventh surface 420a of the second supporting member 420. The second battery 520 may include a 2-2th battery surface 520b facing the seventh surface 420a and a 2-1th battery surface 520a which is opposite to the 2-2th battery surface 520b. According to an embodiment, the 2-1th battery surface 520a and the 2-2th battery surface 520b may be parallel to the third surface 320a of the electronic device 101.

According to various embodiments, the size of the first battery 510 disposed in the first housing 310 may be larger than the size of the second battery 520 disposed in the second housing 320. According to an embodiment, in the unfolded state of the electronic device 101, the first battery 510 may be disposed to be inclined with respect to the second battery 520. According to an embodiment, as the first battery 510 having a relatively large size is disposed to be inclined, the total battery capacity of the electronic device 101 may be efficiently increased. For example, the total battery capacity of the electronic device 101 in which the first battery 510 is disposed to be inclined, and the second battery 520 is disposed in parallel may be larger than the total battery capacity of the electronic device 101 in which the second battery 520 is disposed to be inclined, and the first battery 510 is disposed in parallel. According to an embodiment, the first battery 510 and the second battery 520 may be disposed to be inclined. According to various embodiments, the second supporting member 420 may include the second protruding area 428. According to an embodiment, the second protruding area 428 may protrude toward the fourth surface 420b of the second housing 320 from at least a portion of the edge of the seventh surface 420a of the second supporting member 420. For example, the second protruding area 428 may protrude in the second direction (e.g., the −Z direction) opposite to the first direction (e.g., the +Z direction) from the seventh surface 420a. According to an embodiment, the second protruding area 428 may surround at least a portion of the second battery 520.

According to various embodiments, the electronic device 101 may include a camera module 540 disposed in the second housing 320. The configuration of the camera module 540 may be the same or similar in whole or part as the configuration of the rear camera exposed through the second rear area (e.g., the second rear area 392 in FIG. 1). According to an embodiment, the camera module 540 may protrude from the second supporting member 420 to the fourth surface 320b.

According to various example embodiments of the disclosure, an electronic device (e.g., the electronic device 101 of FIG. 1) may comprise: a foldable housing (e.g., the foldable housing 300 of FIG. 1) including a hinge structure (e.g., the hinge structure 302 of FIG. 3) comprising a hinge, a first housing (e.g., the first housing 310 of FIG. 1) connected to the hinge structure and including a first surface (e.g., the first surface 310a of FIG. 1) and a second surface (e.g., the second surface 310b of FIG. 1) spaced apart from the first surface and inclined at a first angle (e.g., the first angle x1 of FIG. 5B) with respect to the first surface and a second housing connected to the hinge structure and including a third surface (e.g., the third surface 320a of FIG. 1) and a fourth surface (e.g., the fourth surface 320b of FIG. 1) spaced apart from the third surface, wherein in a folded state, the first surface faces the third surface and, in a fully unfolded state, a direction in which the first surface faces is identical to a direction in which the third surface faces, a first support (e.g., the first supporting member 410 of FIG. 5A) disposed in the first housing and including a fifth surface (e.g., the fifth surface 410a of FIG. 5A) inclined at a second angle (e.g., the second angle x2 of FIG. 5B) different from the first angle with respect to the first surface, a first battery (e.g., the first battery 510 of FIG. 4) disposed on the fifth surface, and a display (e.g., the display 200 of FIG. 5A) including a display panel (e.g., the display panel 210 of FIG. 3) extending from the first surface to the third surface and a display driving circuit (e.g., the display driving circuit 220 of FIG. 5A) disposed between the first surface and the first battery.

According to various example embodiments, the first support may include a first area (e.g., the first area 412 of FIG. 5A) adjacent to the hinge structure and a second area (e.g., the second area 414 of FIG. 5A) adjacent to an end of the first housing, wherein a first thickness (e.g., the first thickness d1 of FIG. 5A) of the first area may be greater than a second thickness (e.g., the second thickness d2 of FIG. 5A) of the second area.

According to various example embodiments, the first support may include a third area (e.g., the third area 416 of FIG. 5A) where the display driving circuit is disposed, the third area being positioned between the first area and the second area. The first thickness of the first area may be greater than a third thickness (e.g., the third thickness d3 of FIG. 5A) of the third area.

According to various example embodiments, the second angle may be less than the first angle.

According to various example embodiments, the second angle may be in a range of about 40% to 100% of the first angle.

According to various example embodiments, the electronic device may further comprise a flexible printed circuit board (e.g., the flexible printed circuit board 530 of FIG. 4) disposed between at least a portion of the first battery and the second surface.

According to various example embodiments, the electronic device may further comprise a second support (e.g., the second supporting member 420 of FIG. 8) disposed in the second housing and including a seventh surface (e.g., the seventh surface 420a of FIG. 8) parallel to the third surface, and a second battery (e.g., the second battery 520 of FIG. 8) disposed on the seventh surface.

According to various example embodiments, the fourth surface may be inclined at a third angle with respect to the third surface, and the second angle may be identical to the third angle.

According to various example embodiments, the electronic device may further comprise a camera module including a camera disposed in the second housing. The camera module may protrude from the second support to the fourth surface.

According to various example embodiments, the display may include a folding area (e.g., the folding area 203 of FIG. 1) provided along the hinge structure. The display driving circuit may be disposed in parallel with the folding area.

According to various example embodiments, the first support may include a sixth surface (e.g., the sixth surface 410b of FIG. 5A) facing at least a portion of the display panel and inclined at the second angle with respect to the fifth surface.

According to various example embodiments, the first support may include a first protruding area (e.g., the first protruding area 418 of FIG. 5A) protruding from an edge of the fifth surface and at least partially surrounding a portion of the first battery.

According to various example embodiments of the disclosure, an electronic device (e.g., the electronic device 101 of FIG. 1) may comprise: a foldable housing (e.g., the foldable housing 300 of FIG. 1) including a hinge structure (e.g., the hinge structure 302 of FIG. 3) comprising a hinge, a first housing (e.g., the first housing 310 of FIG. 1) connected to the hinge structure and including a first surface (e.g., the first surface 310a of FIG. 1) and a second surface (e.g., the second surface 310b of FIG. 1) spaced apart from the first surface and inclined at a first angle (e.g., the first angle x1 of FIG. 5B) with respect to the first surface and a second housing (e.g., the second housing 320 of FIG. 1) connected to the hinge structure and including a third surface (e.g., the third surface 320a of FIG. 1) and a fourth surface (e.g., the fourth surface 320b of FIG. 1) spaced apart from the third surface, wherein in a folded state, the first surface faces the third surface and, in a fully unfolded state, a direction in which the first surface faces is identical to a direction in which the third surface faces, a first battery (e.g., the first battery 410 of FIG. 4) disposed in the first housing, a first support (e.g., the first supporting member 410 of FIG. 5A) disposed in the first housing and supporting the first battery, the first support including a first area (e.g., the first area 412 of FIG. 5A) adjacent to the hinge structure and a second area (e.g., the second area 414 of FIG. 5A) adjacent to an end of the first housing, wherein a first thickness (e.g., the first thickness d1 of FIG. 5A) of the first area is greater than a second thickness (e.g., the second thickness d2 of FIG. 5A) of the second area, and a display (e.g., the display 200 of FIG. 5A) including a display panel (e.g., the display panel 210 of FIG. 5A) extending from the first surface to the third surface and a display driving circuit (e.g., the display driving circuit 220 of FIG. 5A) disposed between the first surface and the first battery.

According to various example embodiments, the first support may include a third area (e.g., the third area 416 of FIG. 5A) where the display driving circuit is disposed, the third area being positioned between the first area and the second area. The first thickness of the first area may be greater than a third thickness (e.g., the third thickness d3 of FIG. 5A) of the third area.

According to various example embodiments, the second surface may be inclined at the first angle (e.g., the first angle x1 of FIG. 5A) with respect to the first surface. The first support may include a fifth surface (e.g., the fifth surface 410a of FIG. 5A) inclined at a second angle (e.g., the second angle x2 of FIG. 5A) different from the first angle with respect to the first surface.

According to various example embodiments, the second angle may be in a range of about 40% to 100% of the first angle.

According to various example embodiments, the display may include a folding area provided along the hinge structure. The display driving circuit may be disposed in parallel with the folding area.

According to various example embodiments, the electronic device may further comprise a second support (e.g., the second supporting member 420 of FIG. 8) disposed in the second housing and including a seventh surface (e.g., the seventh surface 420a of FIG. 8) parallel to the first surface, and a second battery (e.g., the second battery 520 of FIG. 8) disposed on the seventh surface.

According to various example embodiments, the fourth surface may be inclined at a third angle with respect to the third surface, and at least a portion of the fourth surface may be plane-symmetrical with at least a portion of the second surface.

According to various example embodiments, the electronic device may further comprise a flexible printed circuit board (e.g., the flexible printed circuit board 530 of FIG. 4) disposed between at least a portion of the first battery and the second surface.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

The invention claimed is:

1. An electronic device, comprising:
   a foldable housing including a hinge structure comprising a hinge, a first housing connected to the hinge structure and including a first surface and a second surface spaced apart from the first surface and inclined at a first angle with respect to the first surface and a second housing connected to the hinge structure and including a third surface and a fourth surface spaced apart from the third surface, wherein in a folded state, the first surface faces the third surface and, in a fully unfolded state, a direction in which the first surface faces is identical to a direction in which the third surface faces;

a first support disposed in the first housing and including a fifth surface inclined at a second angle different from the first angle with respect to the first surface;

a first battery disposed on the fifth surface of the first support; and a display including a display panel extending from the first surface to the third surface and a display driving circuit disposed between the first surface and the first battery.

2. The electronic device of claim 1, wherein the first support includes a first area adjacent to the hinge structure and a second area adjacent to an end of the first housing, and wherein a first thickness of the first area is greater than a second thickness of the second area.

3. The electronic device of claim 2, wherein the first support includes a third area where the display driving circuit is disposed, wherein the third area is positioned between the first area and the second area, and wherein the first thickness of the first area is greater than a third thickness of the third area.

4. The electronic device of claim 1, wherein the second angle is less than the first angle.

5. The electronic device of claim 4, wherein the second angle is in a range of about 40% to 100% of the first angle.

6. The electronic device of claim 1, further comprising a flexible printed circuit board disposed between at least a portion of the first battery and the second surface.

7. The electronic device of claim 1, further comprising:
a second support disposed in the second housing and including a seventh surface parallel to the third surface.

8. The electronic device of claim 7, wherein the fourth surface is inclined at a third angle with respect to the third surface, and wherein the second angle is identical to the third angle.

9. The electronic device of claim 8, further comprising a camera module including a camera disposed in the second housing, wherein the camera module protrudes from the second support to the fourth surface.

10. The electronic device of claim 7, further comprising a second battery disposed on the seventh surface.

11. The electronic device of claim 1, wherein the display includes a folding area provided along the hinge structure, and wherein the display driving circuit is disposed in parallel with the folding area.

12. The electronic device of claim 1, wherein the first support includes a sixth surface facing at least a portion of the display panel and inclined at the second angle with respect to the fifth surface.

13. The electronic device of claim 1, wherein the first support includes a first protruding area protruding from an edge of the fifth surface and at least partially surrounding a portion of the first battery.

14. The electronic device of claim 1, wherein the first support is configured to support the first battery.

15. The electronic device of claim 1, wherein the fourth surface is inclined at a third angle with respect to the third surface, and wherein at least a portion of the fourth surface is plane-symmetrical with at least a portion of the second surface.

* * * * *